United States Patent
Lin (10) Patent No.: US 6,426,556 B1
(45) Date of Patent: Jul. 30, 2002

(54) RELIABLE METAL BUMPS ON TOP OF I/O PADS WITH TEST PROBE MARKS

(75) Inventor: Mou-Shiung Lin, Hsinchu (TW)

(73) Assignee: MEGIC Corporation, Hsin-chu (TW)

( * ) Notice: Subject to any disclaimer, the term of this patent is extended or adjusted under 35 U.S.C. 154(b) by 0 days.

(21) Appl. No.: 09/760,909

(22) Filed: Jan. 16, 2001

(51) Int. Cl.⁷ .............................................. H01L 23/48
(52) U.S. Cl. ...................................... 257/738; 257/762
(58) Field of Search ................................ 257/738, 762, 257/737, 780; 438/18, 613

(56) References Cited

U.S. PATENT DOCUMENTS

| | | | |
|---|---|---|---|
| 5,554,940 A | | 9/1996 | Hubacher .................... 324/765 |
| 5,656,858 A | * | 8/1997 | Kondo et al. ................ 257/337 |
| 5,747,881 A | * | 5/1998 | Hoshomi et al. ............ 257/762 |
| 5,756,370 A | | 5/1998 | Farnworth et al. ............ 438/15 |
| 6,157,079 A | * | 12/2000 | Taguchi ....................... 257/737 |
| 6,162,652 A | | 12/2000 | Dass et al. ..................... 438/18 |

FOREIGN PATENT DOCUMENTS

| JP | 11204525 A | * | 7/1999 | ........... H01L/2/301 |

* cited by examiner

Primary Examiner—Hoai Ho
Assistant Examiner—Thinh Nguyen
(74) Attorney, Agent, or Firm—George O. Saile; Stephen B. Ackerman (57) ABSTRACT

A new method is provided for the creation of metal bumps over surfaces of I/O pads. The area in the surface of I/O pads, which have been used for I/O pads during wafer level semiconductor device testing, is removed in the immediate vicinity of the surface area where the test probe contacts the I/O pad. This removal uses methods of metal dry etching or wet etching.

66 Claims, 6 Drawing Sheets

RELIABLE METAL BUMPS ON TOP OF I/O PADS WITH TEST PROBE MARKS

BACKGROUND OF THE INVENTION (1) Field of the Invention

The invention relates to the fabrication of integrated circuit devices, and more particularly, to a method of removing damage to I/O pads that have been contacted by test probes, thereby avoiding potential solder bump reliability problems.

(2) Description of the Prior Art

The creation of monolithic integrated circuits requires the creation of numerous interacting electrical device elements, which are typically created in or on the surface of a semiconductor substrate. Among these device elements are transistors, diodes, bipolar transistors, CMOS Field Effect Transistors of either N or P channel type and the like. After semiconductor devices and device elements have been created, these devices and device elements must be interconnected in order to form functional semiconductor devices. In addition, the interconnected devices and device elements are further connected to semiconductor substrates, printed circuit boards, flex circuits or a metallized or glass substrates or semiconductor device mounting supports.

In creating semiconductor devices, the technology of interconnecting devices and device features is a continuing challenge in the era of sub-micron devices. Bond pads are frequently used for this purpose, whereby continuous effort is dedicated to creating bond pads that are simple, reliable and inexpensive.

Bond pads are generally used to wire device elements and to provide exposed contact regions of the die. These contact regions are suitable for wiring the die to components that are external to the die. An example is where a bond wire is attached to a bond pad of a semiconductor die at one end and to a portion of a Printed Circuit Board at the other end of the wire. The art is constantly striving to achieve improvements in the creation of bond pads that simplify the manufacturing process while enhancing bond pad reliability.

A frequently used bond pad consists of an exposed aluminum pad. A gold bond wire can be bonded to this aluminum pad. This type of connection however is highly temperature dependent, posing potential reliability problems under operating conditions where the ambient temperature is known to be in excess of 150 degrees C. In addition, even when the ambient temperature is less than approximately 150 degrees C., the aluminum bond pad is susceptible to corrosion simply because it is exposed. Aluminum grows a passivating oxide layer in air and is as a consequence protected against corrosion. Aluminum wiring used in semiconductors, however, contains copper, which does not have a passivating oxide, and the Al—Cu alloy that is used is more vulnerable to corrosion. The corrosion of aluminum wires is caused by several sources such as chlorine transported through the plastic packaging and the passivation materials, chlorine from the etching compounds and as etching by-products, phosphorous acid formed from excess phosphorous in the phosphosilicate glass, etc. Only a small amount of chlorine is required to cause severe local corrosion of the aluminum lines. Aluminum corrosion can, in addition, occur very quickly after metal etching. A water rinse or a water vapor treatment is therefore typically applied to avoid etching introduced corrosion, whereby chlorine compounds and elemental chlorine must be removed from the metal surface immediately after plasma etching.

Materials that are typically used for bond pads include metallic materials, such as tungsten and aluminum, while heavily doped polysilicon can also be used for contacting material. The bond pad is formed on the top surface of the semiconductor device whereby the electrically conducting material is frequently embedded in an insulating layer of dielectric. In using polysilicon as the bond pad material, polysilicon can be doped with an n-type dopant for contacting N-regions while it can be doped with p-type dopant for contacting P-regions. This approach of doping avoids inter-diffusion of the dopants and dopant migration. It is clear that low contact resistance for the bond pad area is required while concerns of avoidance of moisture or chemical solvent absorption, thin film adhesion characteristics, delamination and cracking play an important part in the creation of bond pads.

Figure 1:
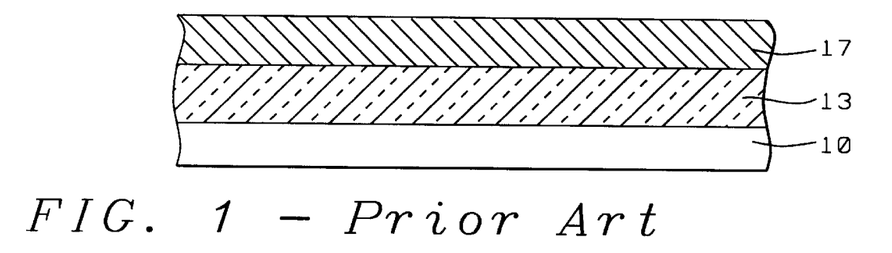
FIG. 1 shows a cross section of a semiconductor surface, a layer of Inter Metal Dielectric (IMD) has been deposited on the surface, and a layer of metal has been deposited.
Figure 2:
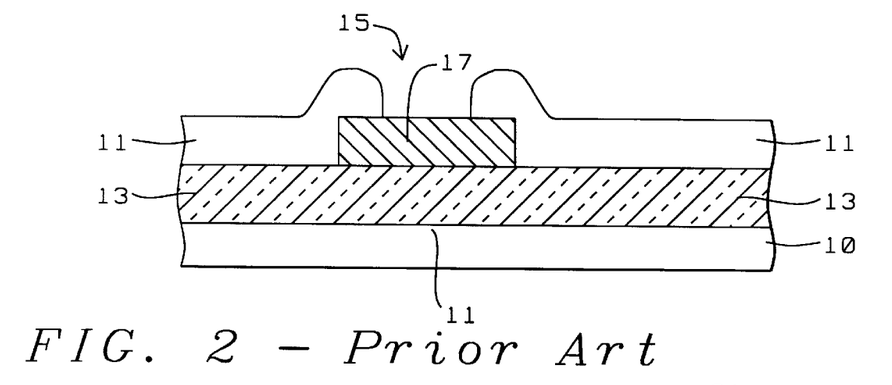
FIG. 2 shows a cross section where the layer of metal has been patterned and etched, creating a contact pad on the surface of the layer of IMD. A layer of passivation has been deposited, patterned and etched, creating an opening in the layer of passivation that aligns with the contact pad.

The conventional processing sequence that is used to create an aluminum bond pad is shown in FIGS. 1 and 2.

The process starts with a semiconductor surface 10, FIG. 1, typically the surface of a silicon single crystalline substrate. A layer 13 of Intra Metal Dielectric (IMD) is deposited over the surface 10. A layer 17 of metal, typically aluminum, has been deposited over the surface of the layer 13 of IMD. Layer 17 of aluminum is patterned and etched typically using a layer of photoresist (not shown in FIG. 1) and conventional methods of photolithography and etching. After the bond pad 17, FIG. 2, has been created in this manner, a layer 11 of passivation is deposited over the layer 13 of IMD. An opening 15 that aligns with the bond pad 17 is created in the layer 11 of passivation, again using methods of photolithography and etching.

Figure 3:
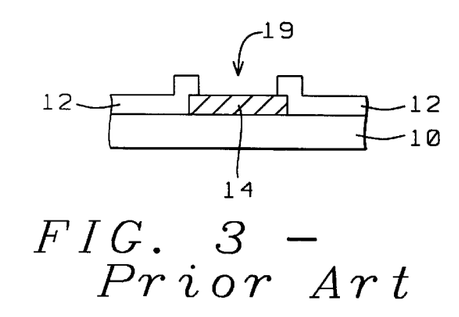
FIG. 3 shows a cross section of a semiconductor surface on the surface of which a contact pad has been created, the semiconductor surface is covered with a patterned layer of passivation.
Figure 4:
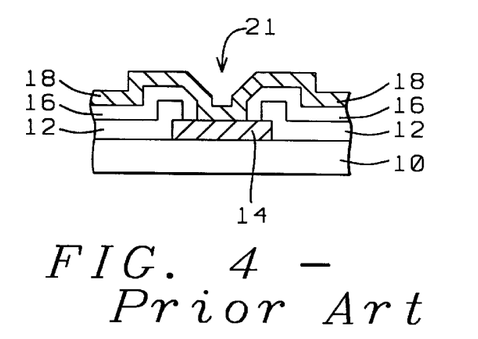
FIG. 4 shows the cross section of FIG. 3 after a patterned layer of dielectric and a layer of metal have been created on the semiconductor surface.

A conventional method that is used to create a solder bump over a contact pad is next highlighted. FIG. 3 shows an example of one of the methods that is used to create an interconnect bump. A semiconductor surface 10 has been provided with a metal contact pad 14, the semiconductor surface 10 is protected with a layer 12 of passivation. An opening 19 has been created in the layer 12 of passivation, the surface of the metal contact pad 14 is exposed through this opening 19. Next, FIG. 4, a dielectric layer 16 is deposited over the surface of the layer 12 of passivation. The layer 16 of dielectric is patterned and etched creating an opening 21 in the layer 16 of dielectric that aligns with the metal pad 14 and that partially exposes the surface of the metal pad 14. A layer 18 of metal, typically using Under-Bump-Metallurgy (UBM), is created over the layer 16 of dielectric, layer 18 of metal is in contact with the surface of the metal pad 14 inside opening 21. The region of layer 18 of metal that is above the metal pad 14 will, at a later point in the processing, form a pedestal over which the interconnect bump will be formed. This pedestal can be further extended in a vertical direction by the deposition and patterning of one or more additional layers that may contain a photoresist or a dielectric material, these additional layers are not shown in FIG. 4. These layers essentially have the shape of layer 16 and are removed during one of the final processing steps that is applied for the formation of the interconnect bump.

Figure 5:
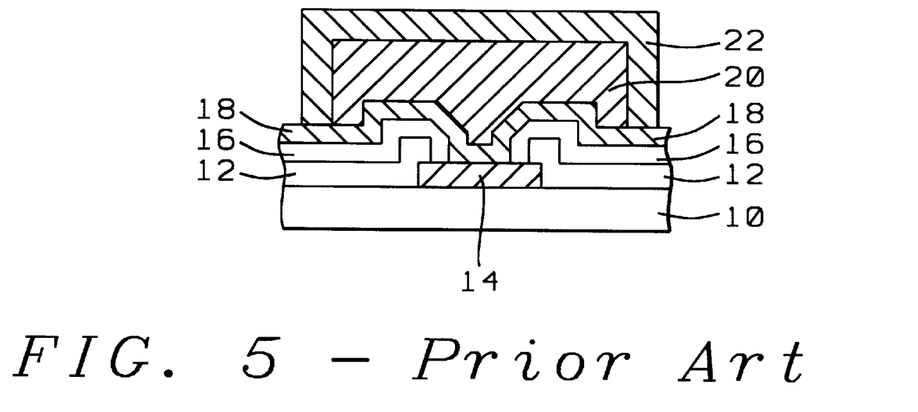
FIG. 5 shows a cross section of FIG. 4 after a layer of bump metal and solder compound have been selectively deposited.

A layer of photoresist (not shown) is deposited, patterned and etched, creating an opening that aligns with the contact pad 14. A layer 20 of metal, such as copper or nickel, FIG. 5, that forms an integral part of the pedestal of the to be created interconnect bump, is next electroplated in the opening created in the layer of photoresist and on the surface of the layer 18 of metal, whereby the layer 18 serves as the lower electrode during the plating process. The final layer 22 of solder is electroplated on the surface of layer 20. The patterned layer of photoresist is then removed.

Figure 6:
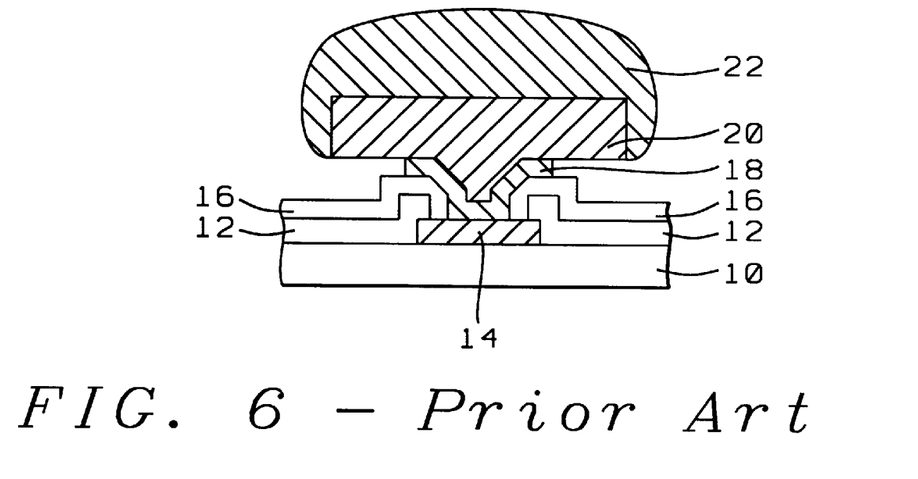
FIG. 6 show a cross section after excessive layers have been removed from the semiconductor surface and after the solder has been flowed, forming the interconnect bump.

The layer 18 of metal is next etched, FIG. 6, leaving in place only the pedestal for the interconnect bump. During this etch process the deposited layers 20 and 22 serve as a mask. If, as indicated above, additional layers of dielectric or photoresist have been deposited for the further shaping of pedestal 18 in FIG. 4, these layers are also removed at this time.

A solder paste or flux is now applied to the layer 22 of solder, the solder 22 is melted in a reflow surface typically under a nitrogen atmosphere, creating the spherically shaped interconnect bump 22 that is shown in FIG. 6.

In addition to the above indicated additional layers of dielectric or photoresist that can be used to further shape the pedestal of the interconnect bump, many of the applications that are aimed at creating interconnect bumps make use of layers of metal that serve as barrier layers or that have other specific purposes, such as the improvement of adhesion of the various overlying layers or the prevention of diffusion of materials between adjacent layers. These layers collectively form layer 18 of FIG. 5 and have, as is clear from the above, an effect on the shape of the completed bump and are therefore frequently referred to as Ball Limiting Metal (BLM) layer. Frequently used BLM layers are successive and overlying layers of chrome, copper and gold, whereby the chrome is used to enhance adhesion with an underlying aluminum contact pad, the copper layer serves to prevent diffusion of solder materials into underlying layers while the gold layer serves to prevent oxidation of the surface of the copper layer. The BLM layer is represented by layer 18 of FIGS. 4 through 6. Contact pads, having dimensions of about 120×120 $\mu$m, are in current practice frequently used as access or input/output contact points during wafer level testing of semiconductor devices. In view of the complexity and density of high performance semiconductor devices, these contact pads will, during a complete cycle of testing, be contacted a number of times. Testing is, as a matter of economic necessity, performed at high speed, which frequently results in landing the test probe on the surface of the contact pad at high speed, resulting in mechanical damage (in the form of probe marks) to the surface of the contact pad. Especially for memory products, a wafer is tested at least two times, that is before and after repair of faulty (weak or bad) memory lines. The distribution of the location of the probe mark over the surface of the contact pad is, in a well controlled testing production line, limited to an area of about 60×60 $\mu$m. Surface damage to the contact pad may occur in the form of a dent in the surface of the contact pad or may even become severe enough that the surface of the contact pad is disrupted, resulting in the occurrence of burring in the surface of the contact pad. After the contact pads have in this manner been used as an I/O point for accessing the semiconductor device during high speed testing, a number of these contact pads are frequently used for the creation of solder bumps over the surface thereof. In instances where the surface of the contact pad is damaged, it is clear that the surface of the contact pad forms a poor basis on which to create a solder bump. The invention addresses this concern and provides a method whereby surface damage to contact pads is removed.

U.S. Pat. No. 6,162,652 (Dass et al.) provides for the testing of an integrated circuit device including depositing a solder bump on a surface of a bond pad.

U.S. Pat. No. 5,756,370 (Farnworth et al.) provides a compliant contact system for making temporary connection with a semiconductor die for testing and a method for fabricating the pliable contact system.

U.S. Pat. No. 5,554,940 (Hubacker) addresses the probing of semiconductor devices that have been provided with contact bumps and the formation of peripheral test pads.

SUMMARY OF THE INVENTION

A principle objective of the invention is to eliminate the effect of surface damage to I/O pads that has been caused by using these I/O pads as contact points for wafer level testing of semiconductor devices.

Another objective of the invention is to eliminate the effect of probe marks on the surface of I/O pads for I/O pads that have been used as contact points for wafer level testing of semiconductor devices.

In accordance with the objectives of the invention a new method is provided for the creation of metal bumps over surfaces of I/O pads. The area in the surface of I/O pads, which have been used for I/O pads during wafer level semiconductor device testing, is removed in the immediate vicinity of the surface area where the test probe contacts the I/O pad. This removal uses methods of metal dry etching or wet etching.

BRIEF DESCRIPTION OF THE DRAWINGS

FIGS. 1 and 2 show a prior art method of creating a contact pad in a semiconductor surface, as follows:

FIGS. 3 through 6 show a prior art method of creating a solder bump overlying a point of electrical contact, as follows:

FIGS. 9 through 14 address the processing steps of the invention, as follows:

DESCRIPTION OF THE PREFERRED EMBODIMENTS

Contact pads, having dimensions of about 120×120 μm, are in current practice frequently used as access or input/output contact points during wafer level testing of semiconductor devices. In view of the complexity and density of high performance semiconductor devices, these contact pads will, during a complete cycle of testing, by contacted a number of times. Testing is as a matter of economic necessity performed at high speed which frequently results in landing the test probe on the surface of the contact pad at high speed, resulting in mechanical damage to the surface of the contact pad. In a well controlled testing production line, the distribution of the probe marks (or the damaged surface area of the contact pad) is limited (controlled) to an area in the range of about 60×60 μm. This surface may occur in the form of a dent in the surface of the contact pad or may even become severe enough that the surface of the contact pad is broken resulting in the occurrence of burring in the surface of the contact pad. After the contact pads have in this manner been used as I/O points during high speed testing, a number of these contact pads are frequently used for the creation of solder bumps over the surface thereof. In instances where the surface of the contact pad is damaged, it is clear that the surface of the contact pad forms a poor basis on which to create a solder bump. The invention addresses this concern and provides a method whereby surface damage to contact pads is removed.

For memory products, such as SRAM devices, probe testing which uses bond pads for accessing the devices, must be performed prior to creating wafer solder bumps on the surface of the bond pads, this in order to allow for memory repairs of faulty devices. As indicated above, the testing can cause damage to the surface of the bond pads, creating problems of solder bump and device reliability.

Figure 7A:
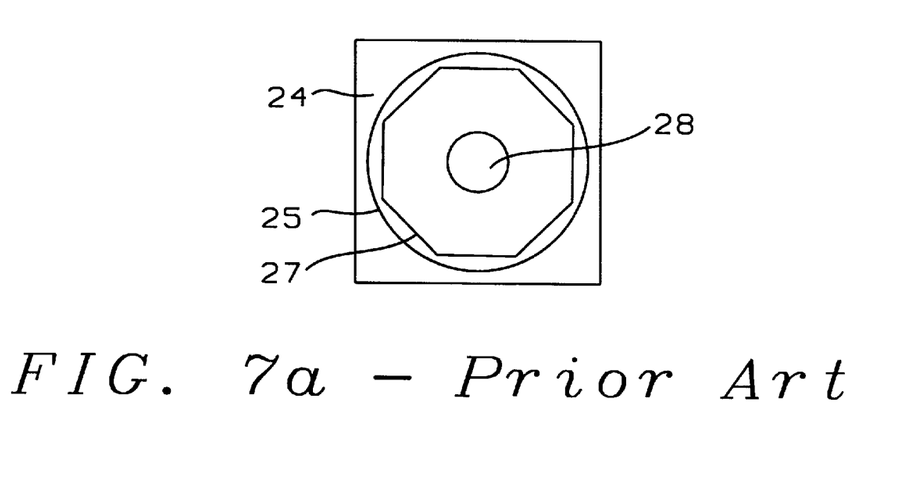
FIGS. 7a and 7b show a top view and a cross section of a metal bump that is created over the surface of an aluminum pad that has been used as an I/O contact pad during device testing.
Figure 7B:
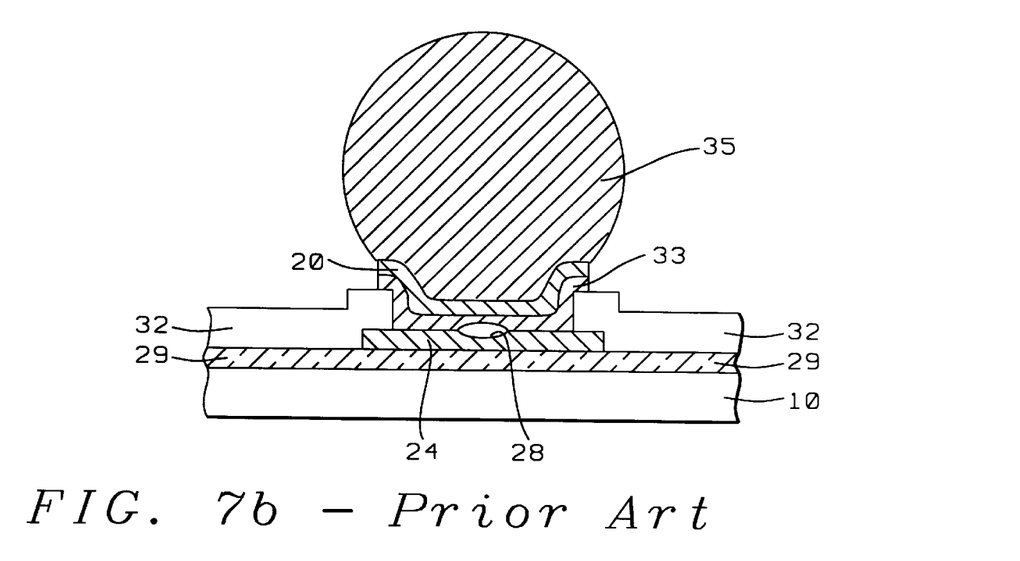

This is further highlighted in FIGS. 7a and 7b. FIG. 7a shows a top view of a metal bump structure that is created using current practices, FIG. 7b shows a cross section of the metal bump structure using current practices. It is assumed that the views that are shown in FIGS. 7a and 7b relate to an aluminum contact pad that has been used as a point of I/O for testing of a device, using a tester probe to contact the aluminum pad.

Shown in FIG. 7a are:

24, an aluminum contact pad

25, a metal bump created overlying aluminum contact pad 24

27, the circumference of the opening above the aluminum contact pad over the surface of which a layer of UBM is created

28, the region in the surface of the aluminum contact pad 24 where a probe mark has been left by the tester probe.

Shown in FIG. 7b are:

10, the silicon substrate over which the aluminum contact pad has been created

24, an aluminum contact pad; aluminum contact pad 24 aligns with a point of electrical contact (30) that has been provided in the surface of substrate 10

28, the probe mark or bump that has been created in the surface of the aluminum contact pad 24 by the tester probe (not shown)

29, a layer of dielectric that has been deposited over the surface of substrate 10;

32, a layer of passivation that has been deposited over the surface of the layer 29 of dielectric; an opening has been created in the layer 30 of passivation

33, a layer of under-bump-metal (UBM) overlying the aluminum pad 24

20, a layer of metal, such as copper or nickel (see FIG. 5) that forms an integral part of the pedestal of the to be created interconnect bump

35, the metal bump created overlying the aluminum contact pad 24.

It is important to note that layer 32 of passivation material may comprise several layers of passivation for applications where additional surface protection is deemed necessary.

From the above it must be understood that, after the testing has been completed, the layer 33 of under bump metal is created overlying the aluminum contact pad 24. The surface of aluminum contact pad 24 is not planar and is in many instances disturbed in an unpredictable manner by the tester probe. The layer 33 of under bump metal does in most cases not fill the damaged surface region 28 of the aluminum pad 24. This opens the potential for trapping foreign and undesirable materials, such as moisture, a processing gas, a plating solution, solvent and the like, in the unfilled (by the layer 33 of under bump metal) regions in or surrounding the probe mark 28 on the surface of the aluminum pad 24.

Figures 8A, 8B:
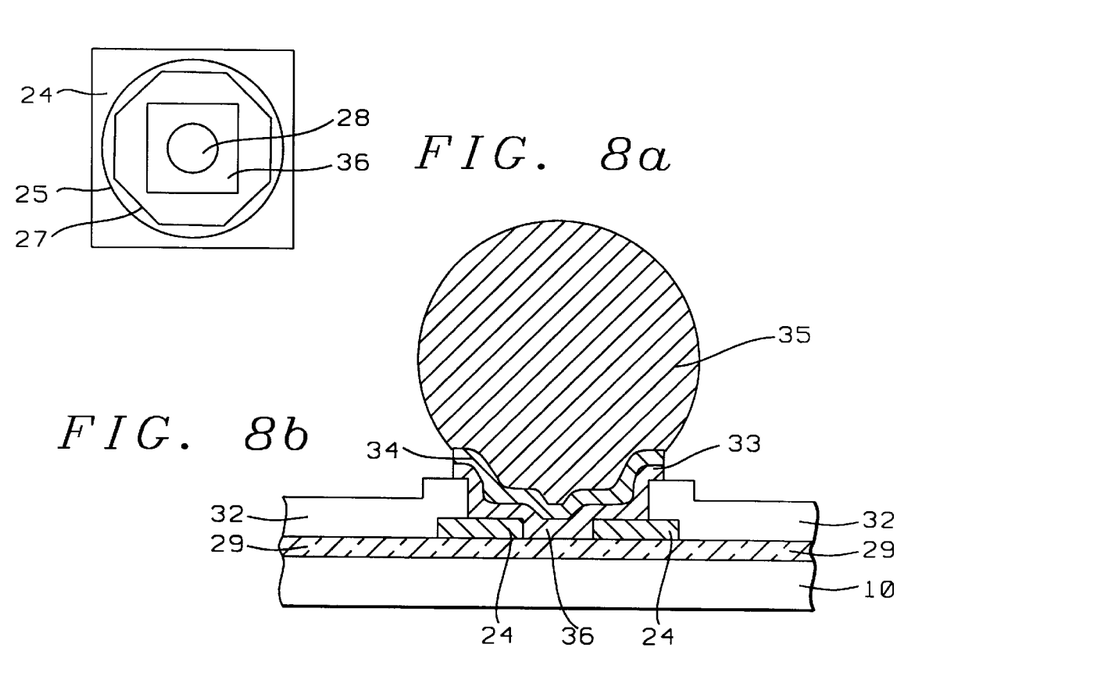
FIGS. 8a and 8b show a top view and a cross section of a metal bump that is created, in accordance with the invention, over the surface of an aluminum pad that has been used as an I/O contact pad during device testing.

Referring now specifically to the views that are shown in FIGS. 8a and 8b, these figures address the solution that is provided by the invention to the above highlighted problem. Shown in FIG. 8a is region 36 on the surface of the aluminum pad 24. This is the region that encloses the largest possible area for the probe mark 28 that has been created in the surface of aluminum pad 24 by the repetitive impact of a tester probe (not shown) for a given testing production line. This region 36 is shown in the cross section of FIG. 8b, where it is shown as a region from where the aluminum of the aluminum pad 24 has been removed. With this removal, the probe mark 28 has been removed from the surface of aluminum pad 24. It is clear from the cross section shown in FIG. 8b that, should surface irregularities occur in the surface of the aluminum contact pad 24 other than the probe mark 28, these surface irregularities will also be removed by the removal of the aluminum from the region 36 shown in cross section in FIG. 8b.

All elements that are shown in FIG. 8b have previously been highlighted in FIG. 7b and are therefore not further explained at this point. The only difference between FIGS. 7b and 8b is the presence of layer 34, FIG. 8b, which is a layer of enhanced UBM which replaces layer 20 (FIG. 7b). This layer will be further explained under the following FIGS. 13 through 15.

Figure 9:
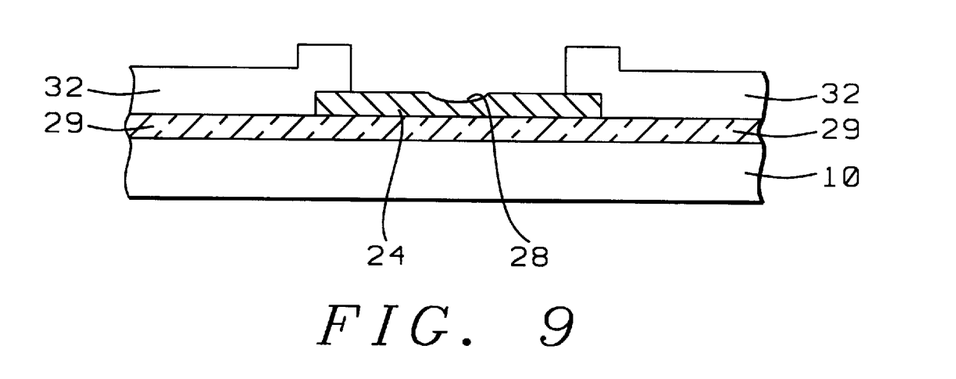
FIG. 9 shows a cross section of a semiconductor surface, a layer of dielectric has been deposited over the semiconductor surface, a contact pad has been provided over a layer of dielectric. A layer of passivation has been deposited, patterned and etched, creating in opening in the layer of passivation that aligns with the contact pad. A probe mark is highlighted in FIG. 9.
Figure 10:
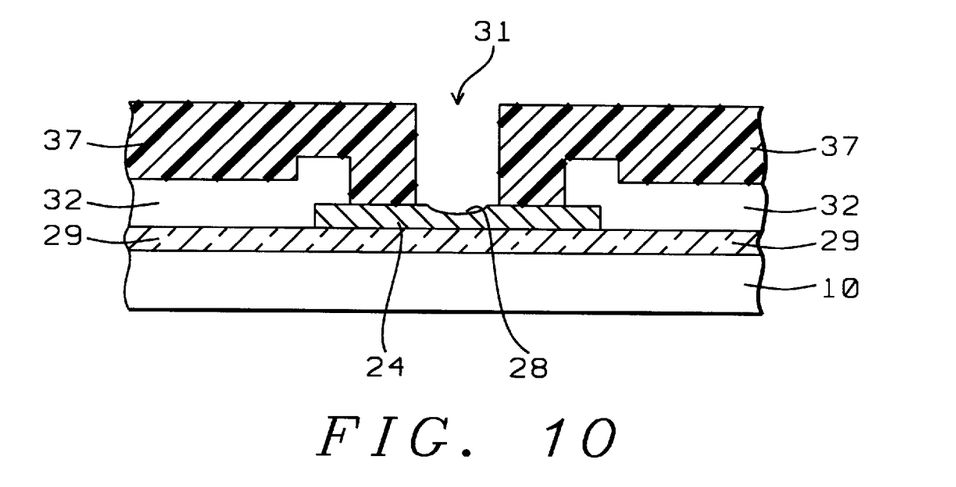
FIG. 10 shows a cross section after a layer of photoresist has been deposited, patterned and etched creating an opening in the layer of photoresist that aligns with the probe mark that has been created in the surface of the contact pad by repetitive contacting of the contact pad by a tester probe.
Figure 11:
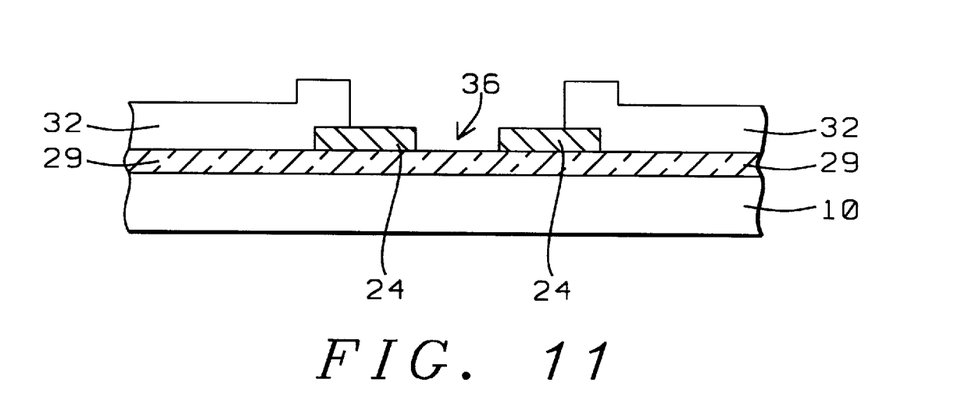
FIG. 11 shows a cross section after the contact pad has been etched in accordance with the opening created in the layer of photoresist. The patterned layer of photoresist has been removed from the surface.

The removal of region 36, FIG. 8b, which will be further highlighted in FIGS. 9 through 11, can be summarized as being performed by depositing a layer of photoresist over the surface of the aluminum pad (typically this implies the deposition of a layer of photoresist over the surface of the entire wafer after wafer level testing has been completed), patterning and etching the layer of photoresist thereby creating openings in the layer of photoresist that align with region 36 for all aluminum pads on the surface of the wafer that have been used as I/O contact points by a tester probe, and removing the aluminum in accordance with the openings that have been created in the layer of photoresist. This latter removal (etching) of the aluminum can be performed using conventional methods of etching aluminum such as plasma enhanced dry etching or wet etching with a $H_3PO_4$ solution. These and other processing steps, which relate to the creation of the reliable metal bump of the invention, are further highlighted in the following drawings.

FIGS. 9 through 15 show the processing sequence of the invention, which has as objective to create a metal bump as shown in top view in FIG. 8a and in cross section in FIG. 8b.

FIG. 9 shows a cross section of substrate 10 on the surface, the following elements are highlighted:

10, a silicon substrate over the surface of which an aluminum contact pad has been created 24, the aluminum contact pad 28, the probe mark or bump that has been created in surface of the aluminum contact pad 24 by repetitive contacting of the contact pad 24 by a tester probe (not shown)

29, a layer of dielectric that has been deposited over the surface of substrate 10

32, a layer of passivation that has been deposited over the surface of the layer 29 of dielectric. An opening has been created in the layer 32 of passivation that aligns with the aluminum contact pad 24, partially exposing the surface of the contact pad 24.

As dielectric material for layer 29 can be used any of the typically applied dielectrics such as silicon dioxide (doped or undoped), silicon oxynitride, parylene or polyimide, spin-on-glass, plasma oxide or LPCVD oxide. The material that is used for the deposition of layer 29 of dielectric of the invention is not limited to the materials indicated above but can include any of the commonly used dielectrics in the art.

The creation of aluminum pad 24 can use conventional methods of metal rf sputtering at a temperature between about 100 and 400 degrees C. and a pressure between about 1 and 100 mTorr using as source aluminum-copper material at a flow rate of between about 10 and 400 sccm to a thickness between about 4000 and 11000 Angstrom. After a layer of AlCu has been deposited, the layer must be patterned and etched to create the aluminum contact pad 24. This patterning and etching uses conventional methods of photolithography and patterning and etching. The deposited layer of AlCu can be etched using $Cl_2$/Ar as an etchant at a temperature between 50 and 200 degrees C., an etchant flow rate of about 20 sccm for the $Cl_2$ and 1000 sccm for the Ar, a pressure between about 50 mTorr and 10 Torr, a time of the etch between 30 and 200 seconds.

In a typical application insulating layers, such as silicon oxide and oxygen-containing polymers, are deposited using Chemical Vapor Deposition (CVD) technique over the surface of various layers of conducting lines in a semiconductor device or substrate to separate the conductive interconnect lines from each other. The insulating layers can also deposited over patterned layers of interconnecting lines, electrical contact between successive layers of interconnecting lines is established with metal vias created in the insulating layers. Electrical contact to the chip is typically established by means of bonding pads or contact pads that form electrical interfaces with patterned levels of interconnecting metal lines. Signal lines and power/ground lines can be connected to the bonding pads or contact pads. After the bonding pads or contact pads have been created on the surfaces of the chip, the bonding pads or contact pads are passivated and electrically insulated by the deposition of a passivation layer over the surface of the bonding pads. A passivation layer can contain silicon oxide/silicon nitride ($SiO_2/Si_3N_4$) deposited by CVD. The passivation layer is patterned and etched to create openings in the passivation layer for the bonding pads or contact pads after which a second and relatively thick passivation layer can be deposited for further insulation and protection of the surface of the chips from moisture and other contaminants and from mechanical damage during assembling of the chips.

Various materials have found application in the creation of passivation layers. Passivation layer can contain silicon oxide/silicon nitride ($SiO_2/Si_3N_4$) deposited by CVD, a passivation layer can be a layer of photosensitive polyimide or can comprise titanium nitride. Another material often used for a passivation layer is phosphorous doped silicon dioxide that is typically deposited over a final layer of aluminum interconnect using a Low Temperature CVD process. In recent years, photosensitive polyimide has frequently been used for the creation of passivation layers. Conventional polyimides have a number of attractive characteristics for their application in a semiconductor device structure, which have been highlighted above. Photosensitive polyimides have these same characteristics but can, in addition, be patterned like a photoresist mask and can, after patterning and etching, remain on the surface on which it has been deposited to serve as a passivation layer. Typically and to improve surface adhesion and tension reduction, a precursor layer is first deposited by, for example, conventional photoresist spin coating. The precursor is, after a low temperature pre-bake, exposed using, for example, a step and repeat projection aligner and Ultra Violet (UV) light as a light source. The portions of the precursor that have been exposed in this manner are cross-linked, thereby leaving unexposed regions (that are not cross-linked) over the bonding pads. During subsequent development, the unexposed polyimide precursor layer (over the bonding pads) is dissolved, thereby providing openings over the bonding pads. A final step of thermal curing leaves a permanent high quality passivation layer of polyimide over the substrate.

The preferred material of the invention for the deposition of layer 32 of passivation is Plasma Enhanced silicon nitride (PE $Si_3N_4$), deposited using PECVD technology at a temperature between about 350 and 450 degrees C. with a pressure of between about 2.0 and 2.8 Torr for the duration between about 8 and 12 seconds. Layer 32 of PE $Si_3N_4$ can be deposited to a thickness between about 200 and 800 Angstrom.

Layer 32 of PE $Si_3N_4$ is next patterned and etched to create an opening in the layer 32 that overlays and aligns with the underlying contact pad 24.

The etching of layer 32 of passivation can use Ar/$CF_4$ as an etchant at a temperature of between about 120 and 160 degrees C. and a pressure of between about 0.30 and 0.40 Torr for a time of between about 33 and 39 seconds using a dry etch process.

The etching of layer 32 of passivation can also use He/$NF_3$ as an etchant at a temperature of between about 80 and 100 degrees C. and a pressure of between about 1.20 and 1.30 Torr for a time of between about 20 and 30 seconds using a dry etch process.

FIG. 10 shows a cross section of the substrate after a layer 37 of photoresist has been deposited over the surface of the layer 32 of passivation, including the opening that has been created in layer 32. The layer 37 of photoresist has been patterned and developed, creating opening 31 in the layer 37 of photoresist. Opening 31 exposes the probe mark 28 in the surface of aluminum pad 24.

Layer 37 of photoresist is typically deposited to a thickness of between about 2000 and 50,000 Angstrom. The methods used for the deposition and development of the layer 37 of photoresist uses conventional methods of photolithography. Photolithography is a common approach wherein patterned layers are formed by spinning on a layer of photoresist, projecting light through a photomask with the desired pattern onto the photoresist to expose the photoresist to the pattern, developing the photoresist, washing off the undeveloped photoresist, and plasma etching to clean out the areas where the photoresist has been washed away. The exposed resist may be rendered insoluble (positive-working) and form the pattern, or insoluble (negative working) and be washed away.

The layer 37 of photoresist will, after patterning and etching, remain in place in an area above the aluminum pad 24 that surrounds the probe mark 28 in the surface of aluminum pad 24. The deposited layer 37 of photoresist can, prior to patterning and etching, be cured or pre-baked further hardening the surface of the layer 37 of photoresist.

Layer 37 of photoresist can be etched by applying $O_2$ plasma and then wet stripping by using $H_2SO_4$, $H_2O_2$ and $NH_4OH$ solution. Sulfuric acid ($H_2SO_4$) and mixtures of $H_2SO_4$ with other oxidizing agents such as hydrogen peroxide ($H_2O_2$) are widely used in stripping photoresist after the photoresist has been stripped by other means. Wafers to be stripped can be immersed in the mixture at a temperature between about 100 degrees C. and about 150 degrees C. for 5 to 10 minutes and then subjected to a thorough cleaning with deionized water and dried by dry nitrogen. Inorganic resist strippers, such as the sulfuric acid mixtures, are very effective in the residual free removal of highly postbaked resist. They are more effective than organic strippers and the longer the immersion time, the cleaner and more residue free wafer surface can be obtained.

The photoresist layer 37 can also be partially removed using plasma oxygen ashing and careful wet clean. The oxygen plasma ashing is heating the photoresist in a highly oxidized environment, such as an oxygen plasma, thereby converting the photoresist to an easily removed ash. The oxygen plasma ashing can be followed by a native oxide dip for 90 seconds in a 200:1 diluted solution of hydrofluoric acid.

FIG. 11 shows a cross section of the substrate 10 after the aluminum contact pad 24 has been etched in accordance with the opening 31 that has been created in the layer 37 of photoresist. This etch of the aluminum pad has created opening 36 in the aluminum pad 24 and has, as is the objective of the invention, removed the probe mark 28 and the regions immediately surrounding the probe mark 28 from the surface of the aluminum pad 24.

The etching of the aluminum pad 24 in accordance with opening 31 can, as previously stated, use methods of plasma enhanced dry etching or wet etching with a $H_3PO_4$ solution. Other methods for the etching of the aluminum pad have previously been highlighted and equally apply at this stage in the process.

FIG. 11 further shows that the patterned layer 37 of photoresist has been removed after opening 36 has been created in the aluminum contact pad 24. Processing conditions for the removal of the layer of photoresist have previously been indicated and therefore do not need to be repeated at this time.

In order to obtain improved processing results and adhesion of UBM metal to the remaining aluminum contact pad 24 and to the exposed surface of IMD layer 29, it is of value to perform an in-situ sputter clean of the exposed surfaces of the aluminum contact pad 24 and the layer 29 of IMD. This in-situ sputter clean is most beneficially performed after the cross section that is shown in FIG. 11 has been obtained, since this is the last step in the processing cycle before a layer of UBM is created.

Figure 12:
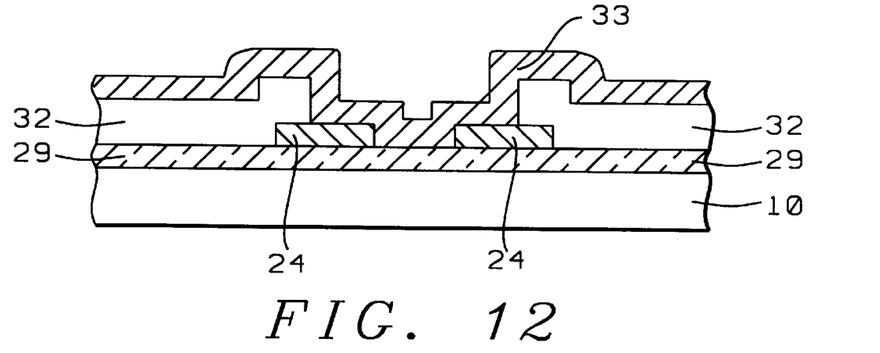
FIG. 12 shows a cross section after a layer of UBM has been formed overlying the contact pad and the layer of passivation.

FIG. 12 shows a cross section after the layer 33 of under bump metal (UBM) has been created aligned with and over the surface of the aluminum contact pad 24. Prior to the creation of layer 33 of UBM, a UBM seed layer (not shown in FIG. 12) can be blanket deposited over the surface of the wafer. Where required, the deposition of a seed layer can further be preceded by the blanket deposition of a barrier layer (not shown in FIG. 12), this dependent on the metal that is being used for the metal bump. Layer 33 of UBM can be deposited by vacuum evaporation and may contain multiple layers of metal such as a layer of chrome, followed by a layer of copper, followed by a layer of gold. From the latter it is apparent that layer 33 of UBM may comprise several layers of metal that are successively deposited.

For a seed layer that is blanket deposited over the surface of the wafer, including the exposed surface of the contact pad 24 and the exposed surface of layer 29 of dielectric (exposed in the opening 36), any of the conventional metallic seed materials can be used. The metallic seed layer can be deposited using a sputter chamber or an Ion Metal Plasma (IMP) chamber at a temperature of between about 0 and 300 degrees C. and a pressure of between about 1 and 100 mTorr, using (for instance) copper or a copper alloy as the source (as highlighted above) at a flow rate of between about 10 and 400 sccm and using argon as an ambient gas.

Figure 13:
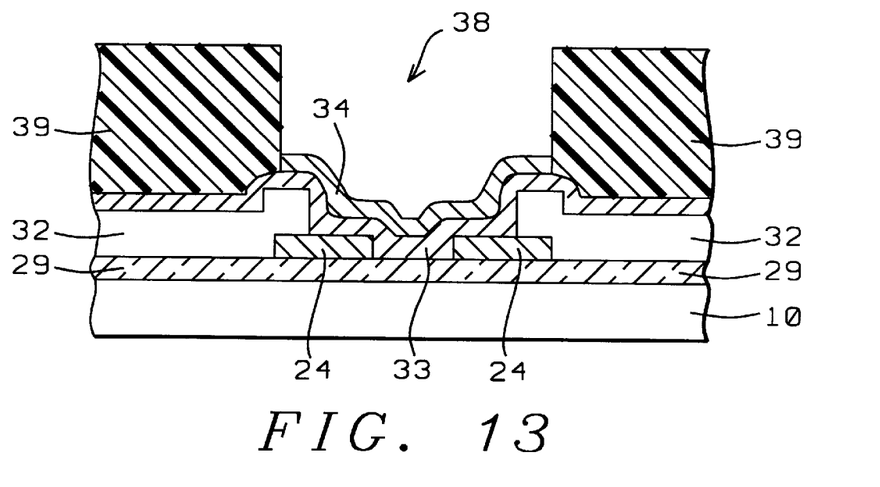
FIG. 13 shows a cross section after a layer of enhanced UBM has been deposited over the surface of the layer of UBM. A layer of photoresist has been deposited, patterned and etched creating an opening in the layer of photoresist that aligns with the contact opening.
Figure 14:
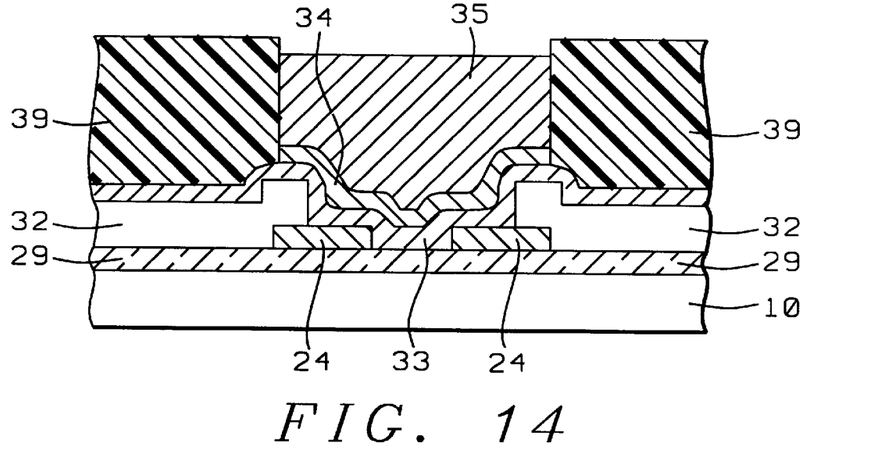
FIG. 14 shows a cross section after a layer of bump metal has been deposited over the layer of enhanced UBM.

FIG. 13 shows how a layer 39 of photoresist is deposited over the layer 33 of UBM. Layer 39 of photoresist is patterned and developed, creating an opening 38 in the layer 39 of photoresist that is slightly wider than the opening of the bonding pad of the to be created solder bump.

Next a layer 34 of enhanced UBM, typically of copper or nickel and of a thickness between about 1 and 10 $\mu$m, FIG. 13, is electroplated over the layer 33 of UBM. The seed UBM layer 33 serves as the common electrode for the electroplating process with the layer of photoresist still being in place. Next the layer 35 of bump metal (typically solder or gold) is electroplated in contact with the layer 34 of enhanced UBM. The layer 35 of electroplated metal is centered in the opening 38 (FIG. 13) that has been created in the layer 39 of photoresist.

Figure 15:
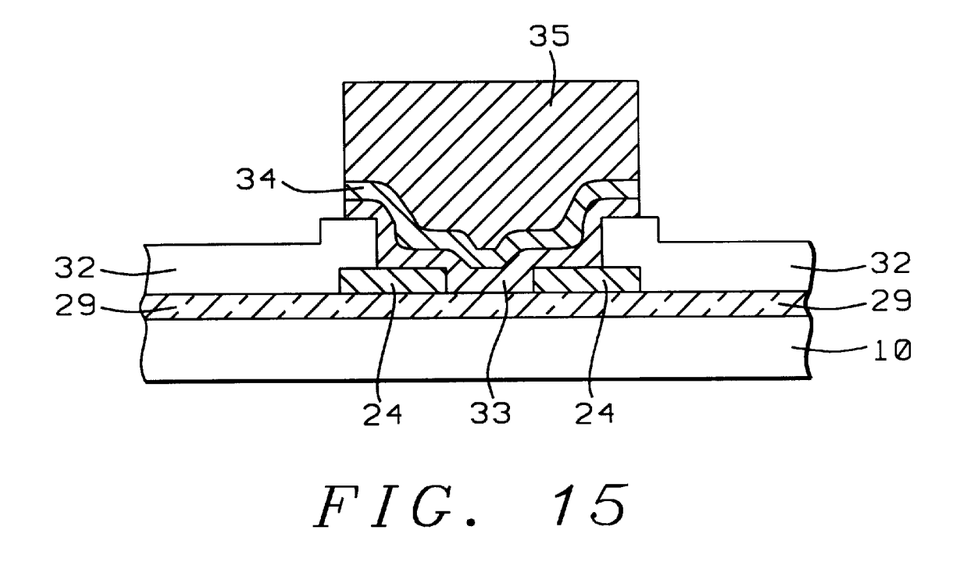
FIG. 15 shows a cross section after photoresist stripping and etching of the layers of UBM and enhanced UBM.

FIG. 15 shows a cross section after the layer 39 (FIG. 14) of photoresist has been removed. The layer 33 of UBM has been etched using the patterned layer 35 of electroplated metal as a mask.

The above summarized processing steps of electroplating that are used for the creation of a metal bump can be supplemented by the step of curing or pre-baking of the layers of photoresist after these layers have been deposited.

Another method that can be used for the creation of a metal bump uses evaporation technology. The process of evaporation also starts with a semiconductor surface wherein a metal point of contact has been provided. A layer of passivation is deposited and patterned, creating an opening in the layer of passivation. A layer of UBM (this layer may be a composite layer of metal such as chromium followed by copper followed by gold in order to promote (with chromium) improved adhesion and to form a diffusion barrier layer or to prevent oxidation (the gold over the copper)) is formed over the layer of passivation and inside the opening created in the layer of passivation. Bump metal is next selectively plated over the deposited layer of UBM and reflowed, in this manner forming a spherically shaped metal bump.

From the cross section that is shown in FIG. 15, the cross section that is shown in FIG. 8b, which is the desired cross section of the invention, can be achieved by forming the metal bump 35 by reflowing the metal bump layer 35 that is shown in FIG. 15. If a seed layer (not shown) and or a barrier layer (not shown) have been deposited as part of the processing sequence of the invention, these layers are to be etched, after the layer 39 of photoresist has been removed from the surface and prior to re-flowing the metal bump layer 35. Conventional methods can be used for these purposes.

To review and summarize the invention:

the invention starts with a semiconductor surface, a layer of dielectric has been deposited over the semiconductor surface, a contact pad has been provided on the layer of dielectric, the contact pad has served as an Input/Output (I/O) point of contact during semiconductor device testing, the contact pad is assumed to be connected to at least one point of electrical contact provided in or on the surface of the substrate, the at least one point of electrical contact is assumed to be connected to at least one semiconductor device having been provided in or on the surface of the substrate, the contact pad having an exposed surface a layer of passivation is deposited over a semiconductor surface including the surface of said contact pad the layer of passivation is patterned and etched, creating an opening in the layer of passivation having a first diameter, partially exposing the surface of the contact pad over a surface area of the first diameter, the opening in the layer of passivation being centered with respect to the contact pad a first layer of photoresist is deposited over the surface of the layer of passivation, including the opening created in the layer of passivation the first layer of photoresist is patterned and etched, creating an opening having a second diameter through the first layer of photoresist, the opening in the first layer of photoresist aligning with and being centered with respect to the contact pad, the second diameter of the opening in the first layer of photoresist being smaller that the first diameter of the opening in the layer of passivation by a measurable amount the contact pad is etched in accordance with the opening created in the first layer of photoresist, partially exposing the surface of the layer of dielectric deposited over the surface of the substrate the patterned layer of first photoresist is removed from the surface of the layer of passivation, including the surface of the etched contact pad an in-situ sputter clean is performed of the exposed surfaces of the contact pad and the partially exposed surface of the layer of dielectric a layer of Under Bump Metallurgy (UBM) is plated over the surface of the layer of passivation, including the exposed surfaces of the contact pad and the partially exposed surface of the layer of dielectric deposited on the surface of the substrate a second layer of photoresist is deposited over the semiconductor surface of the layer of UBM the second layer of photoresist is patterned and etched, creating an opening in the second layer of photoresist that is aligned with the contact pad, partially exposing the surface of the layer of UBM the exposed surface of the layer of UBM is electroplated with a layer of enhanced UBM the layer of enhanced UBM is electroplated with a thick layer of bump metal, partially filling the opening created in the second layer of photoresist the patterned and etched second layer of photoresist is removed from above the semiconductor surface the layer of UBM is etched using the deposited layer of bump metal as a mask, and the surface of said layer of bump metal is reflowed, forming the metal bump.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for forming a metal bump on a semiconductor surface, comprising the steps of:

providing a semiconductor surface, said semiconductor surface having been provided in or on the surface thereof with a contact pad, said contact pad sitting on an underlying layer of dielectric and being in electrical contact with at least one point of electrical contact in or on the surface of said substrate;

depositing a layer of passivation over the surface of said layer of dielectric underlying the contact pad, including the surface of said contact pad;

patterning and etching said layer of passivation, creating an opening in said layer of passivation having a first diameter, partially exposing the surface of said contact pad over a surface area of said first diameter, said first diameter of said opening created in said layer of passivation being smaller than a surface area of said contact pad by a measurable amount;

patterning and etching said contact pad, creating an opening in said contact pad having a second diameter, said second diameter of said opening in said contact pad being smaller than said first diameter of said opening in said layer of passivation by a measurable amount;

sputtering a layer of Under Bump Metallurgy (UBM) over the surface of said layer of passivation, including exposed surface of the contact pad and exposed surface of the underlying dielectric;

depositing and patterning a layer of photoresist, creating an opening in the photoresist with a slightly larger dimension than said first diameter;

electroplating a layer of bump metal in the photoresist opening;

stripping the layer of photoresist and etching said layer of UBM, using said layer of bump metal as a mask; and reflowing the surface of said layer of bump metal, forming the metal bump.

2. The method of claim 1 wherein said opening created in said contact pad has a depth that is less than a height of said contact pad by a measurable amount.

3. The method of claim 1 wherein said opening created in said contact pad has a depth that is equal to a height of said contact pad.

4. The method of claim 1 wherein said passivation layer deposited over the surface of said semiconductor surface comprises a plurality of passivation layers.

5. The method of claim 1 wherein said layer of Under Bump Metallurgy sputtered over the surface of said layer of passivation comprises a plurality of sub-layers of different metallic composition.

6. The method of claim 1 wherein said semiconductor surface is selected from the group of surfaces consisting of semiconductor substrates, printed circuit boards, flex circuits, metallized substrates, glass substrates and semiconductor device mounting support.

7. The method of claim 6 wherein said semiconductor substrate is selected from the group of substrates consisting of semiconductor substrates, ceramic substrates, glass substrates, gallium arsenide substrates, silicon on insulator (SOI) substrates and silicon on sapphire (SOS) substrates.

8. The method of claim 1 wherein said contact pad comprises aluminum or copper or a compound thereof.

9. The method of claim 1 further comprising the additional step of electroplating an enhanced UBM layer, after creating said opening in said layer of photoresist, and prior to electroplating said layer of bump metal.

10. A method for forming a metal bump on a semiconductor surface, comprising the steps of:

providing a semiconductor surface, said semiconductor surface having been provided in or on the surface thereof with a contact pad, said contact pad overlying and being in electrical contact with at least one point of electrical contact in or on the surface of said substrate, said at least one point of electrical contact being created on the surface of a layer of dielectric, said layer of dielectric having been deposited over said semiconductor surface; and partially removing said contact pad, said removing having a removal thickness and removal surface area.

11. The method of claim 10 wherein said removal surface area of said contact pad is smaller than a surface area of said contact pad by a measurable amount.

12. The method of claim 10 wherein said removal thickness of said contact pad is less than a height of said contact pad by a measurable amount.

13. The method of claim 10 wherein said removal thickness of said contact pad equals a height of said contact pad.

14. The method of claim 10 wherein said partially removing said contact pad comprises the steps of:

depositing a layer of passivation over the surface of said layer of dielectric, including the surface of said contact pad;

patterning and etching said layer of passivation, creating an opening in said layer of passivation having a first diameter, partially exposing the surface of said contact pad over a surface area of said first diameter, said first diameter of said opening created in said layer of passivation being smaller than a surface area of said contact pad by a measurable amount; and patterning and etching said contact pad creating an opening in said contact pad having a second diameter, said second diameter of said opening created in said contact pad being smaller than said first diameter of said opening created in said layer of passivation by a measurable amount.

15. The method of claim 10 with the additional steps of:

sputtering a layer of Under Bump Metallurgy (UBM) over the surface of said layer of passivation, including exposed surface of the contact pad, leaving in place a layer of said UBM overlying said contact pad;

depositing and patterning a layer of photoresist, creating an opening in said layer of photoresist with a slightly larger diameter that said first diameter;

electroplating a layer of bump metal in said opening created in said layer of photoresist;

stripping the layer of photoresist and blankly etching said layer of UBM; and reflowing the surface of said layer of bump metal, forming the metal bump.

16. The method of claim 10 wherein said passivation layer deposited over the surface of said semiconductor surface comprises a plurality of passivation layers.

17. The method of claim 15 wherein said layer of Under Bump Metallurgy comprises a plurality of sub-layers of different metallic composition.

18. The method of claim 10 wherein said semiconductor surface is selected from the group of surfaces consisting of semiconductor substrates, printed circuit boards, flex circuits, metallized substrates, glass substrates and semiconductor device mounting support.

19. The method of claim 18 wherein said semiconductor substrate is selected from the group of substrates consisting of semiconductor substrates, ceramic substrates, glass substrates, gallium arsenide substrates, silicon on insulator (SOI) substrates and silicon on sapphire (SOS) substrates.

20. The method of claim 10 wherein said contact pad comprises aluminum or cooper or a compound thereof.

21. The method of claim 15 with the additional steps of electroplating an enhanced layer of UBM, after creating the opening in said layer of photoresist, and prior to the electroplating of said layer of metal.

22. The method of claim 10, said contact pad having served as an Input/Output (I/O) point of contact during semiconductor device testing, said contact pad being connected to at least one point of electrical contact provided in or on the surface of said semiconductor surface, said at least one point of electrical contact being connected to at least one semiconductor device having been provided in or on the surface of said semiconductor surface.

23. The method of claim 15 further comprising performing an in-situ sputter clean of the exposed surfaces of the contact pad and exposed surface of said underlying dielectric, said additional step to be performed prior to said sputtering a layer of Under Bump Metallurgy (UBM).

24. A method for forming a metal bump on a semiconductor surface, a layer of dielectric having been deposited over said semiconductor surface, said contact pad having been formed on the surface of said layer of dielectric, said metal bump overlying said contact pad, said contact pad having served as an Input/Output (I/O) point of contact during semiconductor device testing, said contact pad overlying and being connected to at least one point of electrical contact provided in or on the surface of said semiconductor surface, comprising the steps of:

depositing a layer of passivation over said layer of dielectric underlying said contact pad, including the surface of said contact pad;

patterning and etching said layer of passivation, creating an opening in said layer of passivation having a first diameter, partially exposing the surface of said contact pad over a surface area of said first diameter, said opening in said layer of passivation being centered with respect to said contact pad, said first diameter of said opening created in said layer of passivation being smaller than said surface area of said contact pad by a measurable amount;

depositing a first layer of photoresist over the surface of said layer of passivation, including the opening created in said layer of passivation;

patterning and etching said first layer of photoresist, creating an opening having a second diameter through said layer of photoresist, said opening in said first layer of photoresist aligning with and being centered with respect to said contact pad, said second diameter of said opening in said first layer of photoresist being smaller than said first diameter of said opening in said layer of passivation by a measurable amount;

etching said contact pad in accordance with said opening created in said first layer of photoresist;

removing said patterned layer of first photoresist from the surface of said layer of passivation, including the surface of said etched contact pad;

sputtering a layer of Under Bump Metallurgy (UBM) over the surface of said layer of passivation, including exposed surface of the contact pad and exposed surface of said underlying dielectric;

depositing a second layer of photoresist over the semiconductor surface of the layer of UBM;

patterning and etching said second layer of photoresist, creating an opening in said second layer of photoresist that is aligned with said contact pad, partially exposing the surface of said layer of UBM;

electroplating the partially exposed surface of said layer of UBM with a layer of bump metal, partially filling said opening created in said second layer of photoresist;

removing said patterned and etched second layer of photoresist from above said semiconductor surface; and reflowing the surface of said layer of bump metal, forming the metal bump.

25. The method of claim 24 wherein said layer of passivation comprises PE $Si_3N_4$ deposited to a thickness between about 1000 and 15000 Angstrom.

26. The method of claim 24 wherein said layer of passivation is selected from the group consisting of $SiO_2$, a photosensitive polyimide, phosphorous doped silicon dioxide and titanium nitride, said layer of passivation is deposited to a thickness between about 1000 and 15000 Angstrom.

27. The method of claim 24 wherein said layer of Under Bump Metallurgy comprises a layer of chromium followed by a layer of copper followed by a layer of gold.

28. The method of claim 24 wherein said passivation layer deposited over the surface of said semiconductor surface comprises a plurality of passivation layers.

29. The method of claim 28 wherein at least one of said plurality of passivation layers is selected from the group consisting of PE $Si_3N_4$ and $SiO_2$ and a photosensitive polyimide and phosphorous doped silicon dioxide and titanium nitride.

30. The method of claim 24 wherein said layer of Under Bump Metallurgy comprises a plurality of sub-layers of different metallic composition.

31. The method of claim 24 wherein said etching said layer of UBM comprises dry etching or wet etching.

32. The method of claim 24 wherein said semiconductor surface is selected from the group of surfaces consisting of semiconductor substrates, printed circuit boards, flex circuits, metallized substrates, glass substrates and semiconductor device mounting support.

33. The method of claim 32 wherein said semiconductor substrate is selected from the group of substrates consisting of semiconductor substrates, ceramic substrates, glass substrates, gallium arsenide substrates, silicon on insulator (SOI) substrates and silicon on sapphire (SOS) substrates.

34. The method of claim 24 wherein said contact pad comprises aluminum or a compound thereof.

35. The method of claim 24 wherein said etching said contact pad in accordance with said opening created in said first layer of photoresist comprises methods of plasma enhanced dry etching or wet etching with a $H_3PO_4$ solution.

36. The method of claim 24 wherein said etching said contact pad in accordance with said opening created in said first layer of photoresist comprises etching AlCu using $Cl_2$/Ar as an etchant at a temperature between 50 and 200 degrees C., an etchant flow rate of about 20 sccm for the $Cl_2$ and 1000 sccm for the Ar, a pressure between about 50 mTorr and 10 Torr, a time of the etch between 30 and 200 seconds.

37. The method of claim 24 with additional steps of electroplating an enhanced UBM layer, after the patterning and etching of said second layer of photoresist, and prior to the electroplating the layer of metal bump.

38. A metal bump on a semiconductor surface, comprising:

a semiconductor surface, a layer of dielectric having been deposited over said semiconductor surface, a contact pad having been formed on the surface of said layer of dielectric, said metal bump overlying said contact pad, said semiconductor surface having been provided with at least one point of electrical contact, said contact pad having a surface area in addition to having a height in addition to having a surface area, said contact pad being in electrical contact with said at least one point of electrical contact; and said contact pad having been partially removed, said removing having a removal thickness and removal surface area.

39. The metal bump of claim 38, said contact pad having served as an Input/Output (I/O) point of contact during semiconductor device testing, said contact pad being connected to at least one point of electrical contact provided in or on the surface of said semiconductor surface, said at least one point of electrical contact being connected to at least one semiconductor device having been provided in or on the surface of said semiconductor surface.

40. The metal bump of claim 38, said surface area of said contact pad being larger than said removal surface area by a measurable amount.

41. The metal bump of claim 38, said removal thickness of said contact pad being less than said height of said contact pad by a measurable amount.

42. The metal bump of claim 38, said removal thickness of said contact pad being equal to said height of said contact pad.

43. The metal bump of claim 38 with the addition of:

a patterned and etched said layer of passivation, deposited over the surface of said layer of dielectric, including the surface of said contact pad, an opening having been created in said layer of passivation having a first diameter, partially exposing the surface of said contact pad over a surface area of a first diameter, said opening in said layer of passivation being centered with respect to said contact pad, said first diameter of said opening in said layer of passivation exceeding said removal surface area by a measurable amount;

a layer of Under Bump Metallurgy (UBM) sputtered over exposed surfaces of the contact pad, said layer of UBM partially covering said layer of passivation; and a layer of bump metal electroplated over the surface of said layer of UBM after which said layer of bump metal has been reflowed, forming the metal bump.

44. The metal bump of claim 43 wherein said layer of passivation comprises PE $Si_3N_4$ deposited to a thickness between about 1000 and 15000 Angstrom.

45. The metal bump of claim 43 wherein said layer of passivation is selected from the group consisting of $SiO_2$, a photosensitive polyimide, phosphorous doped silicon dioxide and titanium nitride, said layer of passivation is deposited to a thickness between about 1000 and 15000 Angstrom.

46. The metal bump of claim 43 wherein said layer of Under Bump Metallurgy comprises a layer of chromium followed by a layer of copper followed by a layer of gold.

47. The metal bump of claim 43 wherein said passivation layer comprises a plurality of passivation layers.

48. The method of claim 47 wherein at least one of said plurality of passivation layers is selected from the group consisting of PE $Si_3N_4$ and $SiO_2$ and a photosensitive polyimide and phosphorous doped silicon dioxide and titanium nitride.

49. The metal bump of claim 43 wherein said layer of Under Bump Metallurgy comprises a plurality of sub-layers of different metallic composition.

50. The metal bump of claim 38 wherein said semiconductor surface is selected from the group of surfaces consisting of semiconductor substrates, printed circuit boards, flex circuits, metallized substrates, glass substrates and semiconductor device mounting support.

51. The method of claim 50 wherein said semiconductor substrate is selected from the group of substrates consisting of semiconductor substrates, ceramic substrates, glass substrates, gallium arsenide substrates, silicon on insulator (SOI) substrates and silicon on sapphire (SOS) substrates.

52. The method of claim 38 wherein said contact pad comprises aluminum or a compound thereof.

53. The metal bump of claim 43 with the addition of a layer of enhanced UBM created by electroplating over said sputtered UBM and under said bump metal.

54. The metal bump of claim 53, wherein said enhanced UBM comprises copper or nickel or composite layers of copper and nickel.

55. A metal bump on a semiconductor surface, comprising:

a semiconductor surface, a layer of dielectric having been deposited over said semiconductor surface, a contact pad having been formed on the surface of said layer of dielectric, said metal bump overlying said contact pad, said semiconductor surface having been provided in or on the surface thereof with at least one point of electrical contact having a height and a surface area, a contact pad having a surface area being connected with said at least one point of electrical contact having been provided on said semiconductor surface;

a layer of passivation deposited over said layer of dielectric, including the surface of said contact pad, an opening having been created in said layer of passivation having a first diameter, partially exposing the surface of said contact pad over a surface area of said first diameter, said opening in said layer of passivation being centered with respect to said contact pad, said first diameter of said opening created in said layer of passivation having a surface area that is less than said surface area of said contact pad by a measurable amount;

an opening created in said contact pad, partially exposing the surface of said at layer of dielectric deposited on the surface of said semiconductor surface, said opening having a second diameter, said opening created in said contact pad being centered with respect to said contact pad, said second diameter of said opening in said contact pad being smaller than said first diameter of said opening in said layer of passivation by a measurable amount;

a layer of Under Bump Metallurgy (UBM) sputtered over the surface of said layer of passivation; and a layer of bump metal having been electroplated over the surface of said layer of UBM in an opening of a defined layer of photoresist, said opening in said layer of photoresist overlapping said opening in said passivation layer, after stripping and etching the sputtered UBM using said bump metal as a mask after which said layer of bump metal has been reflowed, forming said metal bump.

56. The metal bump of claim 55 wherein said layer of passivation comprises PE $Si_3N_4$ deposited to a thickness between about 1000 and 15000 Angstrom.

57. The metal bump of claim 55 wherein said layer of passivation is selected from the group consisting of $SiO_2$, a photosensitive polyimide, phosphorous doped silicon dioxide and titanium nitride, said layer of passivation is deposited to a thickness between about 1000 and 15000 Angstrom.

58. The metal bump of claim 55 wherein said layer of Under Bump Metallurgy comprises a layer of chromium followed by a layer of copper followed by a layer of gold.

59. The metal bump of claim 55 wherein said passivation layer over the surface of said semiconductor surface comprises a plurality of passivation layers.

60. The metal bump of claim 59 wherein at least one of said plurality of passivation layers is selected from the group consisting of PE $Si_3N_4$ and $SiO_2$ and a photosensitive polyimide and phosphorous doped silicon dioxide and titanium nitride.

61. The metal bump of claim 55 wherein said layer of Under Bump Metallurgy comprises a plurality of sub-layers of different metallic composition.

62. The metal bump of claim 55 wherein said semiconductor surface is selected from the group of surfaces consisting of semiconductor substrates, printed circuit boards, flex circuits, metallized substrates, glass substrates and semiconductor device mounting support.

63. The metal bump of claim 62 wherein said semiconductor substrate is selected from the group of substrates consisting of semiconductor substrates, ceramic substrates, glass substrates, gallium arsenide substrates, silicon on insulator (SOI) substrates and silicon on sapphire (SOS) substrates.

64. The metal bump of claim 55 wherein said contact pad comprises aluminum or copper or a compound thereof.

65. A method for forming a metal bump on a semiconductor surface, comprising the steps of:

providing a semiconductor surface;

providing a contact pad over said semiconductor surface;

mechanically contacting a portion of said contact pad, whereby damage may occur to said portion of said contact pad;

removing said portion of said contact pad to form an opening;

depositing an under bump metal over said contact pad and in said opening; and forming a metal bump over said contact pad.

66. A metal bump contact, comprising;

a semiconductor surface;

a contact pad over said semiconductor surface, formed of a first material, and having an opening therein;

an under bump metal formed over said contact pad and in said opening; and a metal bump formed over said contact pad.

* * * * *